(12) United States Patent
Cox

(10) Patent No.: US 6,905,333 B2
(45) Date of Patent: Jun. 14, 2005

(54) METHOD OF HEATING A SUBSTRATE IN A VARIABLE TEMPERATURE PROCESS USING A FIXED TEMPERATURE CHUCK

(75) Inventor: Gerald Cox, Hercules, CA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/660,359

(22) Filed: Sep. 10, 2003

(65) Prior Publication Data

US 2004/0137397 A1 Jul. 15, 2004

Related U.S. Application Data

(60) Provisional application No. 60/410,343, filed on Sep. 10, 2002.

(51) Int. Cl.[7] .................................................. H05B 3/68
(52) U.S. Cl. .................... 432/253; 219/444.1; 118/725; 432/5
(58) Field of Search .......................... 432/4, 5, 6, 253, 432/258, 259; 219/443.1, 444.1, 446, 458.1; 118/725

(56) References Cited

U.S. PATENT DOCUMENTS

| | | | |
|---|---|---|---|
| 4,628,991 A | 12/1986 | Hsiao et al. ................. 165/80.4 |
| 4,717,645 A | 1/1988 | Kato et al. ................... 430/296 |
| 4,811,493 A | 3/1989 | Burgio, Jr. ........................ 34/4 |
| 4,863,547 A | 9/1989 | Shidahara et al. ........... 156/345 |
| 4,949,783 A | 8/1990 | Lakios et al. ............... 165/80.1 |
| 4,971,653 A | 11/1990 | Powell et al. ................ 156/626 |
| 5,033,407 A | 7/1991 | Mizuno et al. .............. 118/725 |
| 5,181,556 A | 1/1993 | Hughes ....................... 165/80.1 |
| H1145 H | 3/1993 | Anderson ..................... 165/61 |
| 5,226,056 A | 7/1993 | Kikuchi et al. |
| 5,248,370 A | 9/1993 | Tsui et al. .................... 156/345 |
| 5,259,883 A | 11/1993 | Yamabe et al. .............. 118/725 |
| 5,318,801 A | 6/1994 | Snail et al. ............... 427/248.1 |
| 5,372,648 A | 12/1994 | Yamamoto et al. .......... 118/723 |
| 5,443,997 A | 8/1995 | Tsui et al. .................... 437/225 |
| 5,447,431 A | 9/1995 | Muka .............................. 432/4 |
| 5,520,538 A | 5/1996 | Muka .......................... 432/205 |
| 5,520,742 A | 5/1996 | Ohkase ........................ 118/724 |
| 5,716,207 A * | 2/1998 | Mishina et al. ............. 432/253 |
| 5,778,968 A | 7/1998 | Hendrikson et al. ........ 165/80.1 |
| 5,817,156 A * | 10/1998 | Tateyama et al. ........... 29/25.01 |
| 5,883,778 A | 3/1999 | Sherstinsky et al. ......... 361/234 |
| 5,937,541 A | 8/1999 | Weigand et al. ................ 34/92 |
| 5,970,717 A | 10/1999 | Tateyama ...................... 62/3.2 |
| 6,461,801 B1 | 10/2002 | Wang .......................... 430/329 |
| 6,644,965 B2 * | 11/2003 | Ookura et al. .............. 432/253 |
| 6,660,975 B2 | 12/2003 | Wang et al. .............. 219/444.1 |
| 2001/0047979 A1 | 12/2001 | Wang et al. |

FOREIGN PATENT DOCUMENTS

| | | | |
|---|---|---|---|
| EP | 62282437 | 12/1987 | ................... 21/324 |
| EP | 03224236 | 10/1991 | ................... 21/324 |
| EP | 07045536 | 2/1995 | ................... 21/205 |
| JP | 03-135011 | 6/1991 | |
| JP | 05-013294 | 1/1993 | ................... 21/927 |
| JP | 06-029203 | 2/1994 | ..................... 21/27 |
| JP | 07-254545 | 10/1995 | ..................... 21/27 |
| JP | 08-069977 | 3/1996 | ..................... 21/22 |
| JP | 08-162405 | 6/1996 | ..................... 21/27 |
| JP | 10-083960 | 3/1998 | ................... 21/203 |
| JP | 2889926 B2 | 2/1999 | |
| WO | WO93/26038 | 12/1993 | |
| WO | WO 94/14185 | 6/1994 | |

* cited by examiner

*Primary Examiner*—Gregory Wilson
(74) *Attorney, Agent, or Firm*—Knobbe, Martens, Olson & Bear, LLP

(57) ABSTRACT

A method is provided for heating a substrate in a process chamber using a heated chuck. In accordance with the method, the substrate is lowered onto the chuck and heated to a first temperature less than a temperature of the chuck. The substrate is then raised away from the chuck, and a process is carried out on the substrate while the substrate is supported above the chuck. The substrate is then lowered back to the chuck and heated to a second temperature greater than the first temperature for further processing of the substrate.

6 Claims, 5 Drawing Sheets

METHOD OF HEATING A SUBSTRATE IN A VARIABLE TEMPERATURE PROCESS USING A FIXED TEMPERATURE CHUCK

CROSS REFERENCE TO RELATED APPLICATIONS

This Application claims the benefit of U.S. Provisional Patent Application Ser. No. 60/410,343, filed on Sep. 10, 2002, the entire contents of which is incorporated herein by reference.

FIELD OF THE INVENTION

The present invention relates to heating of substrates with thermal chucks and, more particularly, to variable heating of substrates using fixed temperature thermal chucks.

BACKGROUND OF THE INVENTION

Semiconductor chemical processes are often performed on substrates, such as semiconductor wafers, at elevated temperatures. In certain processes it is desirable to perform various process steps with the substrate at different temperatures. One example of such a process is the removal of ion implanted photoresist, in which the ion implanted material forms a crust in the outer skin of the photoresist. The crust thickness and makeup depends upon the acceleration voltage of the ions, beam current, total dose and the thermal curing temperature of the original photoresist.

If the temperature of the implanted photoresist exceeds a certain temperature, solvents in the underlying photoresist vaporize and explode or "pop" through the crust. The popped crust material tends to spread throughout the inside of the process chamber, creating a substantial amount of particulate and leaving a residue on the chamber walls that is very difficult to remove. Additionally, it can be very difficult to remove the residues that form on the substrate at the popping sites. Often removal of these residues requires an expensive wet chemistry follow-on step.

The temperature at which the crust pops is usually substantially similar to the original photoresist curing temperature. Photoresist is spun onto a wafer in liquid form and then cured via a baking step on a hot plate. Typically, different curing temperatures are chosen for different applications, but curing temperatures generally vary from a low of about 80° C. to a high of about 180° C. or, in some cases, more than 200° C. A low curing temperature usually results in a similarly low implanted photoresist popping temperature.

In order to strip photoresist under the crust material efficiently, it is desirable to elevate the substrate temperature to above about 200° C. and preferably between about 250° C. and 300° C. The addition of a fluorine-bearing gas, such as $CF_4$, can accelerate photoresist stripping at lower temperatures, but the fluorine tends to attack silicon dioxide features on the substrate as well. It is normally extremely undesirable to permit silicon dioxide loss. Accordingly, when using a fluorine gas compound, the amount used is carefully selected depending upon the substrate temperature. Larger percentages of $CF_4$ are permitted when the substrate is at a low temperature, such as between about 25° C. and 80° C. However, when the temperature is elevated above 250° C., for example, the fluorine becomes extremely aggressive toward the silicon dioxide, and unacceptable amounts of the silicon dioxide are removed. In addition, fluorine gas compounds are often used for removing residues left on the substrate after the ion implant step. Therefore, to effectively use fluorine-bearing gas compounds, the substrate temperature must be carefully controlled relative to the percentage of fluorine gas compounds present in the chamber.

The conventional method of heating the substrate when the temperature is constantly cycled is to use lamps or other radiant energy sources. The substrate is generally heated from about room temperature to a predetermined temperature that is just below the popping temperature of the crust material. Even a relatively high percentage of $CF_4$ or other fluorine-bearing gas compound, (typically about 3 percent to about 15 percent of total process gas flow), can be used to remove the ion implanted crust without causing serious damage if the temperature is kept relatively low.

Once the first process step of removing the ion implanted crust is complete, the substrate temperature can be raised to normal photoresist strip temperatures of between about 200° C. and 300° C., preferably about 250° C. to 300° C. Often, very low concentrations of fluorine-bearing gases, as little as 0.2 percent to 1 percent, are used at these higher temperatures.

One problem with using radiant lamp-based heating techniques is the difficulty in maintaining temperature uniformity across the substrate. There is often considerable variation in the radiant heating pattern on the substrate, which can lead to similar variations in the rate of processing across the substrate, so that some areas of the substrate will be further along in the process than other parts of the substrate. As a result, the chemical process time must be extended to be certain the areas which are heated slower have had time to complete the processing. This additional process time, however, also causes greater silicon dioxide loss. As critical geometry sizes shrink in advanced semiconductor technology, even a few Angstroms of silicon dioxide loss may be unacceptable.

An alternative substrate heating method is to use a thermal chuck to heat the substrate and photoresist layer. However, the temperature of the massive thermal chuck generally cannot be changed as quickly, thereby substantially increasing process times. Alternatively, the chuck can be held at a constant temperature that is below the ion implanted photoresist popping temperature. While the relatively large mass of the heated chuck provides a very uniform heat transfer to the substrate, the total process time is generally substantially longer than a lamp based system due to the reduced wafer temperatures. Thus, it is generally economically preferred to use a lamp-based system for heating the wafers due to the increased throughput, despite the undesired non-uniformity issues mentioned above.

Accordingly, it is desirable to combine the benefits of the heating uniformity achieved by a thermal chuck with the wafer temperature variability conventionally achieved by lamp-based wafer heating systems. Thus, a need exists for improved systems and methods for rapidly and uniformly changing the temperature of a substrate during processing.

SUMMARY OF THE INVENTION

Accordingly, it is advantageous to remove the crust of the resist at a lower temperature (e.g., 100° C. to 120° C.), and then raise the temperature to improve throughput for the remainder of the stripping process.

One embodiment of the present invention includes a method of varying the temperature of a substrate in stages using a fixed-temperature thermal chuck by selectively varying a vertical position of the substrate relative to the thermal chuck.

In accordance with one embodiment of the present invention, a method is provided for heating a substrate in a process chamber using a heated chuck. In accordance with the method of this embodiment, the substrate is lowered onto the chuck and heated to a first temperature less than a temperature of the chuck. The substrate is then raised away from the chuck, and a process is carried out on the substrate while the substrate is supported above the chuck. The substrate is then lowered back to the chuck and heated to a second temperature that is greater than the first temperature for further processing of the substrate.

According to another embodiment, a method of controlling a temperature of a substrate during a substrate processing sequence is provided. The method includes providing a thermal chuck at a first temperature that is at least a maximum desired substrate temperature and maintaining the chuck at the first temperature throughout the remaining process steps. The method further comprises supporting a wafer above the chuck, and selectively increasing and decreasing a gap between the substrate and the chuck in order to vary the temperature of the substrate. In another embodiment, the substrate is maintained in proximity to the chuck for a pre-determined length of time in order to increase the temperature of the substrate to a desired temperature. In still another embodiment, a chamber pressure is varied in order to facilitate increased heat transfer between the chuck and the substrate.

Yet another embodiment of the present invention provides a substrate processing system. According to this embodiment, the system includes a processing chamber, a thermal chuck configured to be maintained at a constant temperature while loading, processing and unloading a plurality of wafers in sequence. The system further includes a support structure configured to support a substrate. The support structure is coupled to a motion control system configured to selectively vary a distance between a top surface of the thermal chuck and a bottom surface of the substrate. The system of this embodiment is also configured to process a substrate when the substrate is supported at two or more of the discrete positions.

According to another embodiment, the substrate processing system further comprises an automatic control system programmed to perform the following steps, in sequence: reduce a chamber pressure to a processing pressure; lower the substrate into proximity with the chuck; maintain the substrate in proximity to the chuck until the substrate reaches a first temperature; raise the substrate above the chuck; and perform a first processing step with the substrate raised.

In still another embodiment, the automatic control system is programmed to perform the following steps in sequence after performing the first processing step: lower the substrate into proximity with the chuck and maintain the substrate in proximity to the chuck until the substrate reaches a second, higher temperature; and performing a second processing step.

Additionally, in yet another embodiment, the automatic control system can be further configured to change a chamber pressure to an intermediate pressure between a process pressure and a load/unload pressure before lowering the substrate into proximity with the chuck.

Another embodiment of the present invention includes a method of controlling silicon dioxide loss during processing of a silicon dioxide substrate by varying a concentration of a fluorine-containing gas compound as an inverse function of substrate temperature. In one embodiment, this method is performed in a process chamber with a thermal chuck that is maintained at a single, constant temperature throughout a plurality of substrate processing cycles.

Yet another embodiment of the present invention comprises a method of controlling silicon dioxide loss during processing of a silicon dioxide substrate by varying a plasma power level as a function of substrate temperature. In one embodiment, this method is performed in a process chamber with a thermal chuck that is maintained at a single, constant temperature throughout a plurality of substrate processing cycles.

DETAILED DESCRIPTION OF THE PREFERRED EMBODIMENTS

Figure 1:
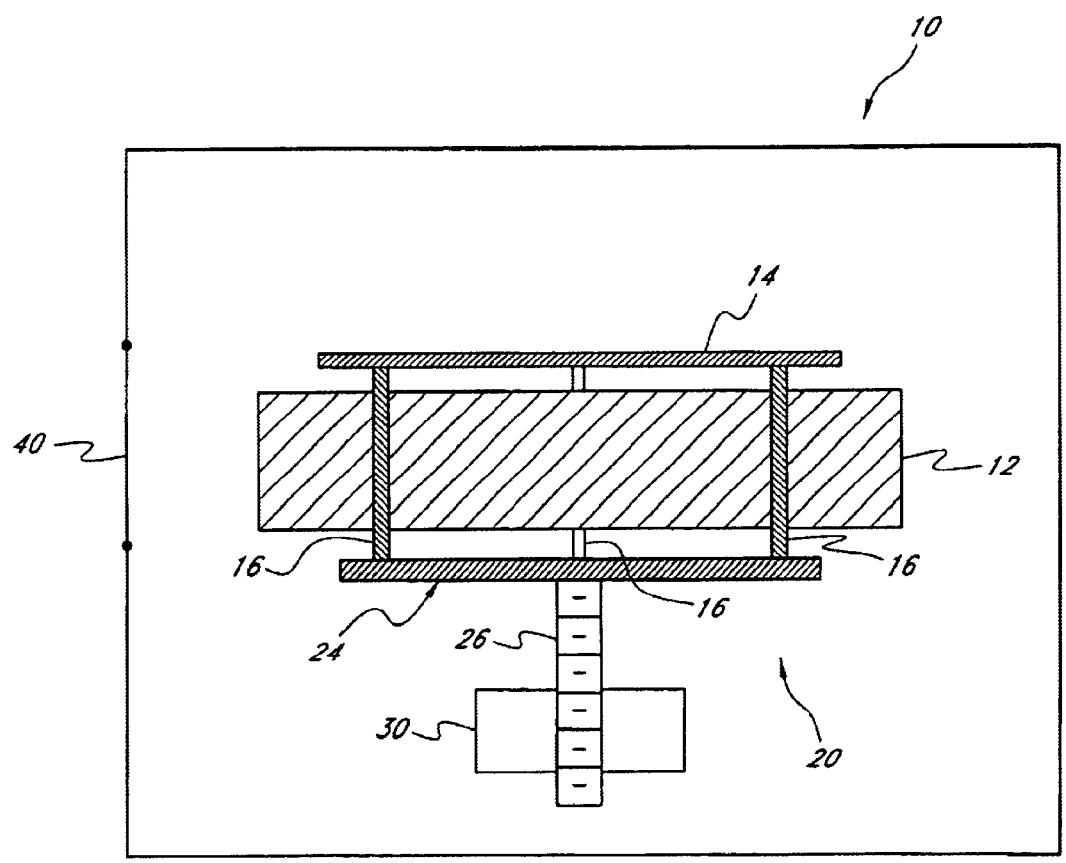
FIG. 1 is a schematic diagram in cross-section of one embodiment of a thermal chuck and wafer lift system having certain features in accordance with the present invention.

A process chamber 10 in accordance with the preferred embodiments is illustrated in FIG. 1. The chamber 10 is in fluid communication with a remote plasma unit (not shown), although the skilled artisan will appreciate that in situ plasma processors are also envisioned. A wafer support structure or chuck 12 is situated in the process chamber 10. The chuck 12 is initially heated (e.g., by hot fluid circulated therethrough, by electric resistance heating or by any other suitable method) to a process temperature and is preferably maintained at a substantially constant temperature during the subsequent processes described below.

As used herein, the term "constant temperature" is a broad term, and is used in its ordinary sense and refers, without limitation, a desired temperature that is substantially unchanging over a finite period of time. As used herein, "substantially unchanging" means that the temperature is maintained within an acceptable range over the finite period of time in question. The skilled artisan will recognize in view of the present disclosure that a certain degree of variation in the temperature of an item is acceptable, and a temperature need not remain exactly at a single value in order to be considered "constant" over a specific period of time.

A substrate 14 is loaded into the process chamber 10 through a gate valve 40. As illustrated in FIG. 1, the substrate 14 is initially supported above the chuck 12 by lift pins 16 that extend through the wafer chuck 12, Alternatively, the substrate 14 can be supported or suspended by a pick-up device or other mechanism. One or more of the lift pins 16 may be provided with a thermocouple (not shown) to detect the temperature of the substrate 14. Alternatively, other direct contact measurement devices such as pyrometers, or radiometric (optical) temperature measurement devices can be used, such as optical fiber thermometers, or spot radiation thermometers.

The substrate can be raised or lowered relative to the chuck 12 by a lift mechanism 20. In the illustrated embodiment, the lift mechanism is operable to extend or retract the lift pins 16, thereby moving the pins 16 vertically up or down relative to the chuck 12. In the illustrated embodiment, the lift mechanism 20 comprises a lift platform 24 on which the lift pins 16 are supported. The lift platform 24 is connected to an end of a lift screw 26, which can be a worm screw or other motion controlling screw. The lift screw 26 can be driven by a motor 30 to move the lift platform 24 thereby extending or retracting the lift pins 16. The motor 30 can be any suitable type of motor, such as a permanent magnet motor, or a stepper motor.

In alternative embodiments, the lift mechanism 20 can include other mechanical, electrical and/or electronic components to control the vertical motion of the substrate. For example, the height of the lift platform 24 can be controlled by actuation of a scissor lifts, pneumatic or hydraulic cylinders, gears, etc. Additionally, the lift mechanism 20 can be operated by an automatic controller configured to control the position of a wafer 14 relative to the thermal chuck 12.

The chuck 12 temperature is preferably held constant at a desired high temperature throughout the entire substrate processing cycle. Thus, the chuck is preferably raised to a desired high temperature before a substrate is loaded into the chamber, and the chuck is then maintained at the desired high temperature at least until all substrate heating steps are complete. In one embodiment, the chuck is maintained at the high temperature until after all substrate processing steps are complete, and in still another embodiment, the chuck is maintained at the high temperature until after the substrate is removed from the chamber.

In some embodiments, the desired high temperature at which the chuck 12 is maintained can be equal to the highest process temperature, such as a bulk removal process temperature. For photoresist removal, for example, the temperature of the chuck 12 preferably is set to between about 200° C. and 300° C., and more preferably between about 225° C. and 250° C. Alternatively, the chuck 12 can be maintained at a desired high temperature that is greater than the highest process temperature. For example, in the same photoresist removal process described above, the chuck could be maintained at a temperature greater than 300° C. in order to allow a wafer to be heated to the highest desired process temperature more quickly.

The substrate 14 is supported on the pins 16 while the process chamber 10 is evacuated by a pump (not shown) to a desired process pressure, typically between about 0.5 Torr and 3 Torr for photoresist removal. After the process chamber 10 has been evacuated, the substrate 14, which will typically be at or slightly above room temperature, is lowered onto the hot chuck 12. Since there is little thermally conductive gas between the substrate 14 and heated chuck 12, the thermal rise of the substrate 14 will be slowed, thereby preventing the problem of curling of the substrate 14.

The temperature rise of the substrate 14 can be measured versus time using a test substrate 14 with thermocouples, radiometric devices or other heat measuring instrumentation. Initially, there will be a significant temperature gradient between the substrate 14 and heated chuck 12. Therefore, the rate of temperature rise will be greatest immediately after the substrate 14 is lowered onto the chuck 12. As the temperature of the substrate 14 becomes closer to the temperature of the heated chuck 12, the rate of temperature increase of the substrate 14 will be reduced.

Using the lift mechanism 20, the substrate 14 can alternately be lowered onto, and raised away from, the heated chuck 12 by the lift mechanism 20. Preferably, the substrate 14 is not lifted so far away from the chuck 12 that the process chamber 10 gas flow dynamics are affected, since such disturbances could affect process strip rate and/or uniformity. In the illustrated embodiment, the precision lift mechanism 20 positions the substrate 14 in a predictable and repeatable position above the heated chuck 12. The heat transfer between the substrate 14 and chuck 12 can thereby be controlled. Using data gathered from empirical instrumented tests, the temperature of the substrate 14 can be predicted as a function of time and distance from the fixed temperature chuck 12.

Using these predicted values, an automatic control system can be developed to control the temperature of the substrate by varying the position of a wafer supported on the support pins above the thermal chuck. An automatic control system can also include any of a variety of sensors for continuously monitoring one or more variables affecting the substrate processing. For example, sensors can be provided for monitoring the temperature of the wafer, the temperature of the chuck, the position of the wafer support pins, the pressure within the chamber, and/or any other parameter affecting wafer processing. The information from such sensors can be used by the control system to increase or decrease the gap between the wafer and the chuck in order to achieve the desired processing conditions.

As used herein, lowering a wafer "onto" the thermal chuck refers to both a situation in which the wafer is lowered into direct physical contact with the chuck and to a situation in which the wafer is lowered to a position that is slightly above, but very close to the surface of the thermal chuck. For example, lowering the wafer to a position in which the wafer is supported a few thousandths of an inch (e.g. about 0.05 mm to about 0.254 mm) above the chuck falls within the meaning of lowering the wafer "onto" the chuck in the present disclosure. Similarly, raising the wafer "away from" the chuck broadly refers to any action which increases the gap between the wafer and the chuck.

In many processes, it is desirable to maintain the substrate 14 at a steady temperature during the various process steps in order to better manage and control the process results. In an exemplary ion implanted photoresist removal process, once the wafer temperature reaches the initial temperature range just below the popping temperature of the crust, the substrate 14 can be lifted a small distance away from the heated chuck 12 to limit further temperature increase of the substrate 14. Since the substrate 14 is suspended in a relative vacuum, the primary modes of heat transfer to or from the wafer will occur by conduction through the support pins 16 or by radiation to (or from) the chuck and/or the process chamber walls. Since the contact between the support pins 16 and the substrate is very small (thereby minimizing conduction through the pins), and since the chuck will be at a higher temperature than the wafer, the substrate 14 will generally remain at a relatively constant temperature (within a few degrees of acceptable variation) until it is lowered back onto the heated chuck 12. Therefore, an incrementally stepped and controllable substrate 14 temperature can be achieved using a fixed temperature thermal chuck 12 by controlling a position of the wafer relative to the chuck 12.

Figure 2A:
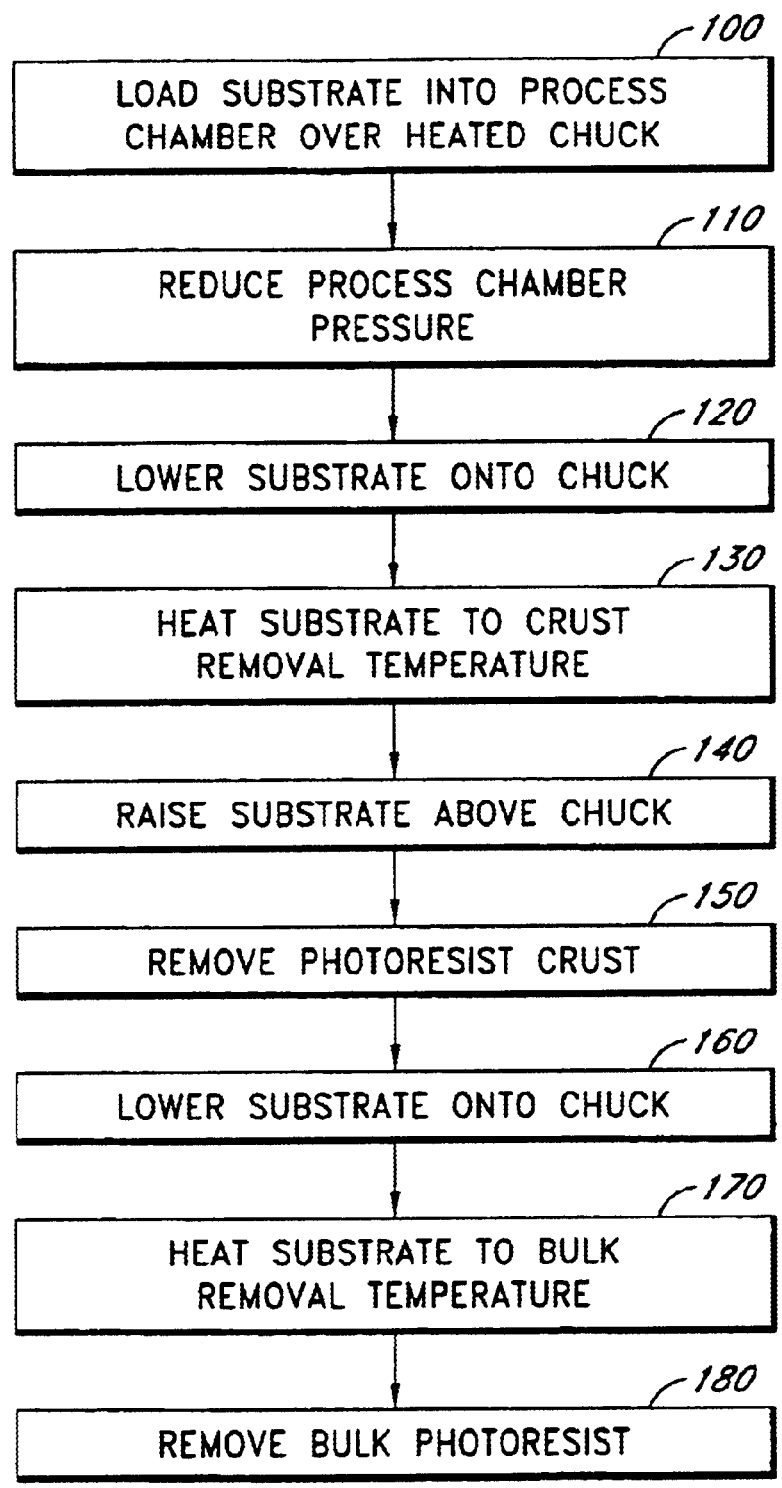
FIG. 2a is a flow chart illustrating one exemplary process sequence having certain features in accordance with the present invention.

Referring now to FIG. 2a, a preferred process for removing implanted resist is shown. Before beginning the process, the thermal chuck is preferably heated to a temperature which is at least as high as the highest temperature to which the wafer will be heated during the process. For example, in the embodiment illustrated in FIG. 2, the thermal chuck can be heated to and maintained at or above the bulk removal temperature of step 170. The thermal chuck can advantageously be maintained at or above the bulk removal temperature throughout a single process run, or throughout a batch of process runs (i.e. throughout the processing of several substrates).

In accordance with one preferred embodiment of a photoresist removal process, the substrate is loaded 100 into the process chamber at atmospheric pressure. The substrate is initially supported above the chuck (e.g., by the lift pins, in the embodiment of FIG. 1). The chamber is then evacuated 110 to approximately the pressure at which the process is to be carried out (preferably between about 0.5 Torr and 3 Torr). The chuck is maintained at about the process temperature (preferably between about 200° C. and 300° C., and more preferably between about 225° C. and 250° C.) throughout the process described, and preferably throughout a batch of several wafers processed in sequence.

After the chamber pressure has been reduced 110, the substrate is lowered 120 towards the heated wafer chuck. Preferably, the substrate is lowered 120 until it physically contacts the chuck, although in some embodiments the substrate can be held slightly above the chuck (i.e. the wafer can be supported a few thousandths of an inch, or about 0.05 mm and about 0.254 mm, above the chuck) thereby allowing the wafer to be heated very uniformly, primarily by radiation. The substrate is heated 130 for a predetermined period until the substrate reaches the intermediate temperature at which the crust removal 150 is to be carried out. In general, the crust removal temperature is typically lower than the temperature at which the chuck is maintained. The substrate is then raised 140 away from the chuck for the next step.

Once the substrate is raised 140 above the chuck, the implanted crust of the resist is removed 150 while the wafer is at the crust removal temperature. In addition to a conventional plasma asher chemistry including oxidant gases (e.g., 5 slm $O_2$ through the remote plasma unit, carrier gas), hydrogen and a fluorine-bearing gas are preferably added to facilitate the removal of the photoresist crust. For example, 1,000 sccm of 3–15% $H_2$ (in $N_2$ or He) and/or $CF_4$ (1–3% of total flow) is preferably added to the flow through a remote plasma generator, although an in situ plasma generator can also be used.

After the crust is removed, the substrate is again lowered 160 onto the chuck in order to heat the substrate again. The substrate is heated 170 to the higher temperature at which the standard (non-implanted) resist removal process will be carried out. The standard (non-implanted) resist can then be removed 180 more rapidly at the elevated temperature.

Figure 2B:
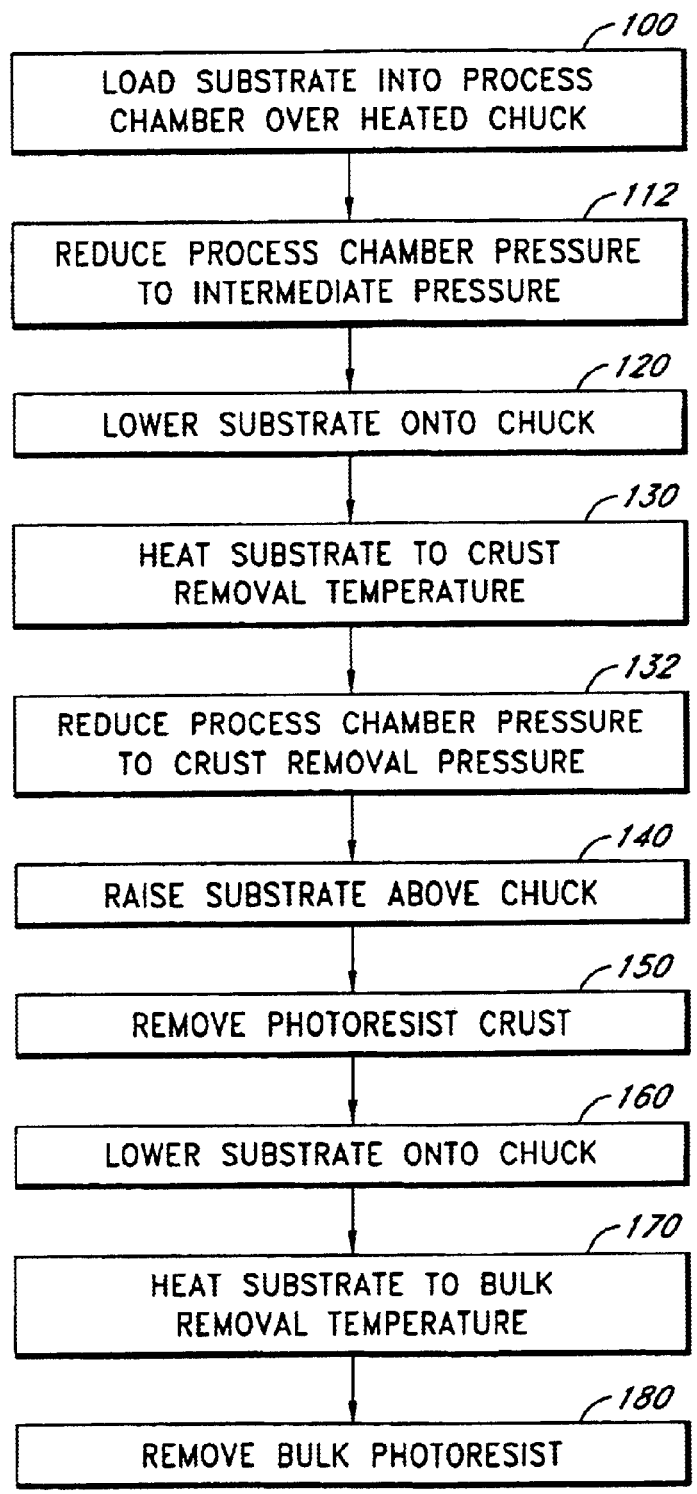
FIG. 2b is a flow chart illustrating an alternative exemplary process sequence having certain features in accordance with the present invention.

In an alternative embodiment, illustrated for example in FIG. 2b, the rate of heating applied to the substrate 14 can be accelerated by changing the pressure within the process chamber 10 to an intermediate pressure between the process pressure and a load/unload pressure to improve the heat transfer between the substrate 14 and thermal chuck 12. According to some embodiments the intermediate pressure is preferably between about 10 Torr and about 100 Torr as described, for example in co-owned U.S. Pat. No. 6,409,932, which issued Dec. 27, 2000 and which is incorporated by reference herein. In the embodiment illustrated in FIG. 2b, the pressure in the chamber is reduced 112 to the intermediate heating pressure before heating the substrate to a crust removal temperature 130. In order to perform the crust removal process, the chamber pressure is again reduced 132 to the desired process pressure for the crust removal process.

Figure 2C:
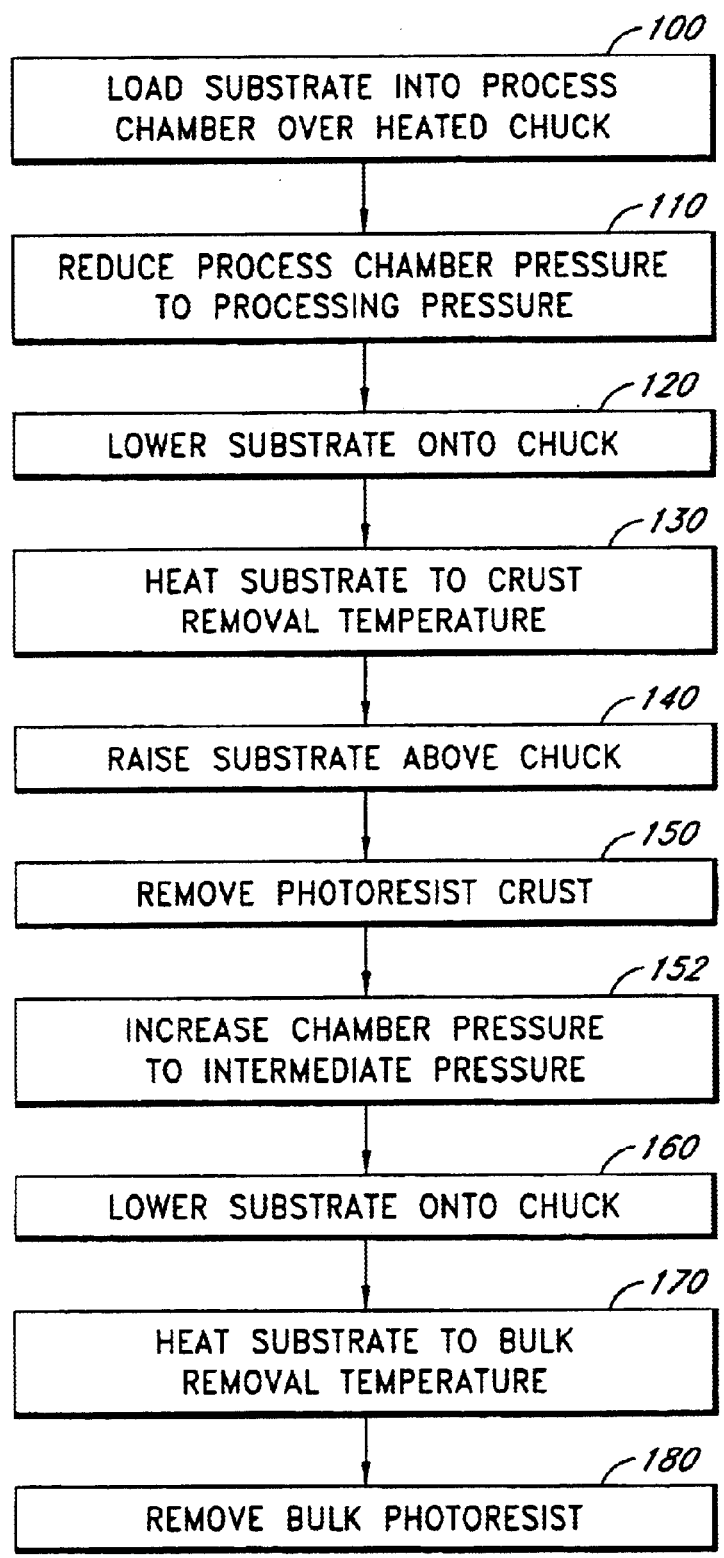
FIG. 2c is a flow chart illustrating an alternative exemplary process sequence having certain features in accordance with the present invention.

In still another alternative embodiment, illustrated for example in FIG. 2c, the rate of heating applied to the substrate 14 for the second (higher temperature) stage of processing can be accelerated as the temperature of the substrate 14 approaches the temperature of the thermal chuck 12. As will be understood by the skilled artisan, under normal conditions, the rate of heat transfer between the thermal chuck and the substrate will decrease as as the temperature of the substrate 14 approaches the temperature of the thermal chuck 12. Thus, by increasing 152 the chamber pressure to an intermediate pressure, the rate of heat transfer between the chuck 12 and the substrate 14 can be increased above the rate at which heat would otherwise be transferred with the chamber at the process pressure.

In still another embodiment, the processes of FIGS. 2b and 2c can be combined by changing the pressure within the process chamber 10 to an intermediate pressure for both heating steps 130 and 170. Additionally, in other processing cycles involving further processing steps, the chamber pressure could be changed to an intermediate pressure for any heating step.

In the implanted resist strip process shown in FIG. 2a, the substrate is heated in two stages 130, 170. In some cases, however, it may be desirable to heat the substrate in more than two stages. For example, in the graph of FIG. 3, the substrate is heated in three ramp stages 200, 210, 220. During these heating stages 200, 210, 220, the substrate is in contact with, or is in close proximity to, the chuck. At the steady state stages 250, 260 between the heating stages 200, 210, 220, during which processing of the substrate would generally occur, the substrate is moved away from the chuck and thus remains at a relatively constant temperature. Additionally, the process chamber is preferably held at a low pressure at least during the steady state stages 250 and 260. In further embodiments, the chamber pressure can be held at an intermediate pressure (about 10 to about 100 Torr) during the ramp stages 200, 210 and 220.

To control the reaction rate of the $CF_4$ or other fluorine-bearing gas compound on the silicon dioxide or other sensitive layers of the substrate during processing, the percentage or amount of $CF_4$ can be changed as a function of substrate temperature. For example, in the photoresist removal processes described above, 3 percent $CF_4$ gas is used at the lowest temperature range. Higher percentages of $CF_4$ can be used, depending on the maximum permissible silicon dioxide loss for a particular process.

Figure 3:
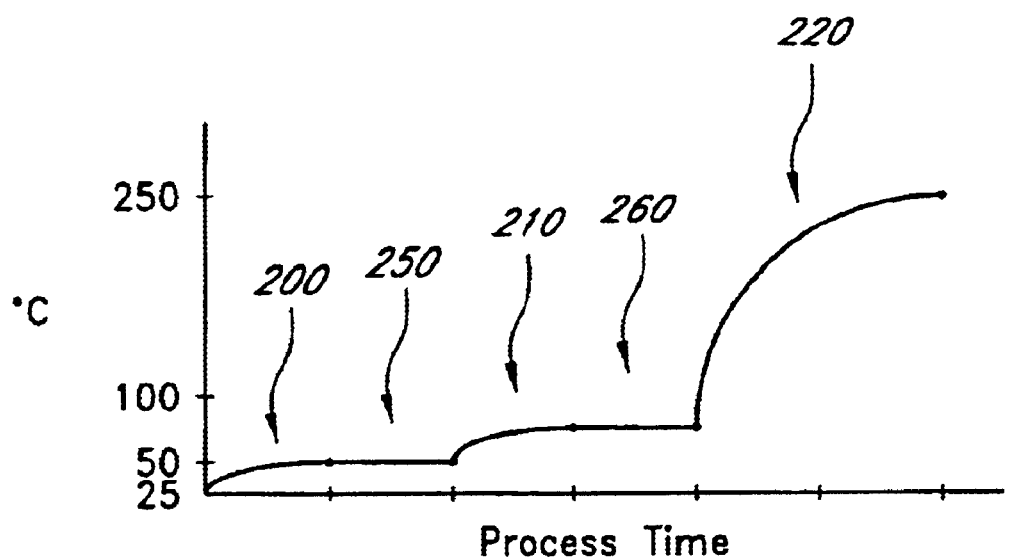
FIG. 3 is a graph of substrate temperature versus process time for an exemplary process in which a substrate is heated in several stages.
Figure 4:
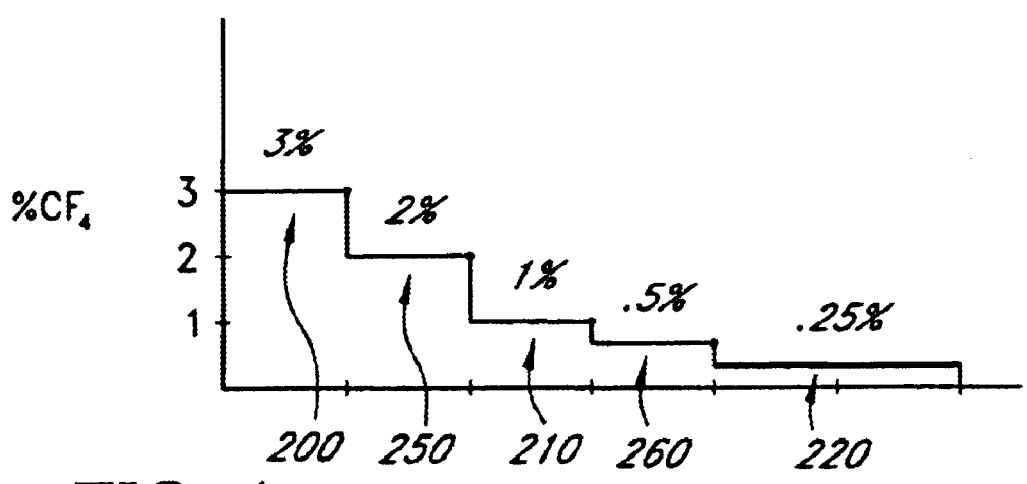
FIG. 4 is a graph of $CF_4$ concentration versus process time and process temperature for the process of FIG. 3.

FIG. 4 illustrates a graph of $CF_4$ concentration as a function of process time with stepped variations corresponding to the substrate process temperatures shown in the constant-temperature chuck process of FIG. 3. As shown, at low substrate temperatures 200, or while the substrate is rising from room temperature to the initial temperature plateau, the percentage of $CF_4$ gas can be at the maximum desired safe level. At the second stage of higher temperature 250, the $CF_4$ percentage can be lowered, for example, to about 2 percent. The sequence can be continued until the $CF_4$ percentage is reduced to as little as about 0.25 percent, 0.125 percent, or even 0 percent. Alternatively, the percentage of $CF_4$ or other fluorine-bearing gas can be held constant as the substrate temperature rises. However, more predictable and consistent results and shorter overall process times can be achieved if the substrate is maintained at relatively constant temperatures while changing the gas composition.

As an additional or alternative means of controlling silicon dioxide loss, the plasma power level can optionally be varied with the substrate temperature during the one or more of the constant-temperature chuck processes described above. For example, in the process of FIG. 3, the plasma power can be reduced during the ramping steps 200, 210 and 220, thereby further reducing the risk of silicon dioxide loss.

After removing 180 the remainder of the photoresist, the chamber is vented and the processed wafer is removed or unloaded from the chamber. A new substrate may then be loaded into the chamber and the sequence can be started again.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. It is further contemplated that various combinations and sub-combinations of the specific features and aspects of the embodiments may be made and still fall within the scope of the invention. It is intended that the scope of the present invention herein disclosed should not be limited by the particular disclosed embodiments described above, but should be determined only by a fair reading of the claims that follow.

It should be noted that certain objects and advantages of the invention have been described above for the purpose of describing the invention and the advantages achieved over the prior art. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

I claim:

1. A method of heating a substrate in a process chamber using a heated chuck, comprising:
   lowering the substrate onto the chuck;
   heating the substrate to a first temperature less than a temperature of the chuck;
   raising the substrate away from the chuck while the substrate is at the first temperature;
   processing the substrate while the substrate is at the first temperature and raised away from the chuck;
   lowering the substrate back onto the chuck;
   heating the substrate to a second temperature greater than the first temperature; and
   further processing the substrate after heating the substrate to the second temperature.

2. The method of claim 1, wherein the processing comprises photoresist ashing.

3. The method of claim 1, wherein the temperature of the chuck is maintained constant throughout all of the method steps.

4. A method of controlling a temperature of a substrate during a substrate processing sequence, the method comprising:
   providing a thermal chuck at a first temperature that is at least a maximum desired substrate temperature and maintaining the chuck at said first temperature;
   supporting a wafer above the chuck;
   lowering the wafer into a heating position until the wafer reaches a low processing temperature, then raising the wafer to an upper position above the chuck;
   conducting processing of the wafer at the upper position while the wafer is at the low processing temperature;
   lowering the wafer into the heating position until the wafer reaches a high processing temperature, then raising the wafer to the upper position above the chuck; and
   conducting processing of the wafer at the upper position while the wafer is at the high processing temperature;
   wherein each of the above steps is performed while maintaining the chuck at the first temperature.

5. The method of claim 4, further comprising maintaining the substrate in proximity to the chuck for a pre-determined length of time in order to increase the temperature of the substrate to a desired temperature.

6. The method of claim 4, further comprising varying a chamber pressure during a heating or cooling step to facilitate increased heat transfer between the chuck and the substrate.

* * * * *

UNITED STATES PATENT AND TRADEMARK OFFICE
CERTIFICATE OF CORRECTION

PATENT NO.         : 6,905,333 B2                                    Page 1 of 1
APPLICATION NO. : 10/660359
DATED                  : June 14, 2005
INVENTOR(S)        : Gerald Cox It is certified that error appears in the above-identified patent and that said Letters Patent is hereby corrected as shown below:

On the title page item (56), Col. 1, line 15, under "U.S. Patent Documents", insert the following references cited:

| Document Number | Date | Name | Classification |
| --- | --- | --- | --- |
| --US-6,097,005 A | 08-2000 | Akimoto, Masami | 219/444.1 |
| US-5,927,077 A | 07-1999 | Hisai et al. | 62/3.3 |
| US 6,518,548 B2 | 02-2003 | Sugaya et al. | 219/444.1 |
| US-6,809,299 B2 | 10-2004 | Hiramatsu et al. | 219/444.1-- |

On the title page item (56), Col. 2, line 5, under "Foreign Patent Documents", delete "21/927" and insert -- 21/027 --.

Signed and Sealed this

Tenth Day of April, 2007

JON W. DUDAS
*Director of the United States Patent and Trademark Office*